(12) United States Patent
Nakano et al.

(10) Patent No.: US 10,640,643 B2
(45) Date of Patent: May 5, 2020

(54) PYROLYTIC BINDER

(71) Applicants: NATIONAL UNIVERSITY CORPORATION TOKYO UNIVERSITY OF AGRICULTURE AND TECHNOLOGY, Fuchu-shi, Tokyo (JP); SUMITOMO SEIKA CHEMICALS CO., LTD., Kako-gun, Hyogo (JP)

(72) Inventors: Koji Nakano, Fuchu (JP); Kiyoshi Nishioka, Himeji (JP)

(73) Assignees: NATIONAL UNIVERSITY CORPORATION TOKYO UNIVERSITY OF AGRICULTURE AND TECHNOLOGY, Tokyo (JP); SUMITOMO SEIKA CHEMICALS CO., LTD., Hyogo (JP)

( * ) Notice: Subject to any disclaimer, the term of this patent is extended or adjusted under 35 U.S.C. 154(b) by 0 days.

(21) Appl. No.: 16/089,839

(22) PCT Filed: Mar. 23, 2017

(86) PCT No.: PCT/JP2017/011593
§ 371 (c)(1),
(2) Date: Sep. 28, 2018

(87) PCT Pub. No.: WO2017/170079
PCT Pub. Date: Oct. 5, 2017

(65) Prior Publication Data
US 2019/0136046 A1    May 9, 2019

(30) Foreign Application Priority Data
Apr. 1, 2016    (JP) .................................. 2016-074334

(51) Int. Cl.
*C08L 69/00*    (2006.01)
*C08K 3/00*    (2018.01)
(Continued)

(52) U.S. Cl.
CPC .............. *C08L 69/00* (2013.01); *C08G 64/02* (2013.01); *C08K 3/00* (2013.01); *C08K 3/40* (2013.01);
(Continued)

(58) Field of Classification Search
CPC ........ C08G 69/00; C08G 64/30; C08G 64/18; C08G 64/183; C08G 64/025; C08G 63/64;
(Continued)

(56) References Cited

U.S. PATENT DOCUMENTS 8,927,680 B2    1/2015 Morishita et al.
2007/0187656 A1    8/2007 Evans et al.
(Continued)

FOREIGN PATENT DOCUMENTS

| CN | 101384629 A | 3/2009 |
| CN | 103562264 A | 2/2014 |

(Continued)

OTHER PUBLICATIONS

Zhang et al., Macromol. Rapid Commun. 2012, 33, 693-697.*
(Continued)

*Primary Examiner* — Shane Fang
(74) *Attorney, Agent, or Firm* — Birch, Stewart, Kolasch & Birch, LLP

(57) ABSTRACT

The present invention provides a thermally decomposable binder for which dewaxing can be performed at low temperatures, and an inorganic fine particle-dispersed paste composition comprising this binder. Specifically, the present
(Continued)

invention provides a thermally decomposable binder comprising an aliphatic polycarbonate resin comprising a constituent unit represented by formula (1):

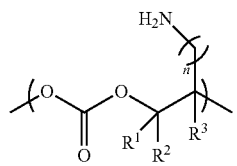

wherein $R^1$, $R^2$, and $R^3$ are identical or different, and each represents a hydrogen atom, an alkyl group having 1 to 10 carbon atoms, or an aryl group having 6 to 20 carbon atoms, and n is 1 or 2, and provides an inorganic fine particle-dispersed paste composition comprising this binder.

7 Claims, 1 Drawing Sheet

(51) Int. Cl.
  *C08G 64/02* (2006.01)
  *C08K 3/40* (2006.01)
  *C09K 11/57* (2006.01)
  *C09K 11/77* (2006.01)

(52) U.S. Cl.
  CPC ...... *C08K 2201/001* (2013.01); *C09K 11/574* (2013.01); *C09K 11/778* (2013.01); *C09K 11/7734* (2013.01)

(58) Field of Classification Search
  CPC  C09K 11/7734; C08K 2201/001; C08K 3/40; A61K 47/34
  See application file for complete search history.

(56) References Cited

U.S. PATENT DOCUMENTS

| | | |
|---|---|---|
| 2013/0281633 A1 | 10/2013 | Allen |
| 2014/0008588 A1 | 1/2014 | Fujimoto et al. |
| 2014/0072806 A1 | 3/2014 | Allen et al. |
| 2016/0095933 A1 | 4/2016 | Coady et al. |
| 2018/0030203 A1 | 2/2018 | Nakano et al. |

FOREIGN PATENT DOCUMENTS

| | | |
|---|---|---|
| CN | 103732650 A | 4/2014 |
| CN | 105348505 A | 2/2016 |
| EP | 2 716 679 A1 | 4/2014 |
| JP | 5-024934 A | 2/1993 |
| JP | 2008-285545 A | 11/2008 |
| JP | 2010-106286 A | 5/2010 |
| JP | 2011-178606 A | 9/2011 |
| JP | 2014-9282 A | 1/2014 |
| JP | 2014-503018 A | 2/2014 |
| JP | 2014-514429 A | 6/2014 |
| JP | 2014-185260 A | 10/2014 |
| JP | 5781939 A | 9/2015 |
| JP | 5781939 B2 | 9/2015 |
| WO | WO 2004/042797 A1 | 5/2004 |
| WO | WO 2004/042797 A2 | 5/2004 |
| WO | WO 2010/075232 A1 | 7/2010 |
| WO | WO 2011/101395 A1 | 8/2011 |
| WO | WO 2012/128028 A1 | 9/2012 |
| WO | WO 2016/139831 A1 | 9/2016 |
| WO | WO 2017/170079 A1 | 10/2017 |
| WO | WO 2019/045092 A1 | 3/2019 |

OTHER PUBLICATIONS

Cupta et al., "Photoacid Generators for Catalytic Decomposition of Polycarbonate," J. Appl. Polym. Sci. (2007), vol. 105, pp. 2655-2662.
Non-Final Office Action dated Feb. 21, 2019, in U.S. Appl. No. 15/552,395.
Final Office Action dated Jul. 10, 2019, in U.S. Appl. No. 15/552,395.
Office Action with Search Report dated Dec. 27, 2018, in Chinese Patent Application No. 201580077337.5.
Darensbourg et al., "Aliphatic Polycarbonates Produced from the Coupling of Carbon Dioxide and Oxetanes and Their Depolymerization via Cyclic Carbonate Formation," Macromolecules (2011), vol. 44 No. 8, pp. 2568-2576.
Extended European Search Report dated Aug. 1, 2018, in European Patent Application No. 15883997.7.
International Search Repon (PCT/ISA/210) issued in PCT/JP2015/074937, dated Nov. 24, 2015.
International Search Report (PCT/ISA/210) issued in PCT/JP2017/011593, dated Jun. 20, 2017.
Liu et al., "Synthesis and Properties of Functional Aliphatic Polycarbonates," Journal of Polymer Science: Part A: Polymer Chemistry (Dec. 15, 2003), vol. 41, No. 24, pp. 4001-4006.
Song et al., "Synthesis and characterization of amino-functionalized poly(propylene carbonate)", RSC Advances, vol. 5, No. 41, pp. 32092-32095.
Written Opinion (PCT/ISA/237) issued in PCT/JP2015/074937, dated Nov. 24, 2015.
Written Opinion (PCT/ISA/237) issued in PCT/JP2017/011593, dated Jun. 20, 2017.
Non-Final Office Action dated Dec. 20, 2019, in U.S. Appl. No. 15/552,395.

\* cited by examiner

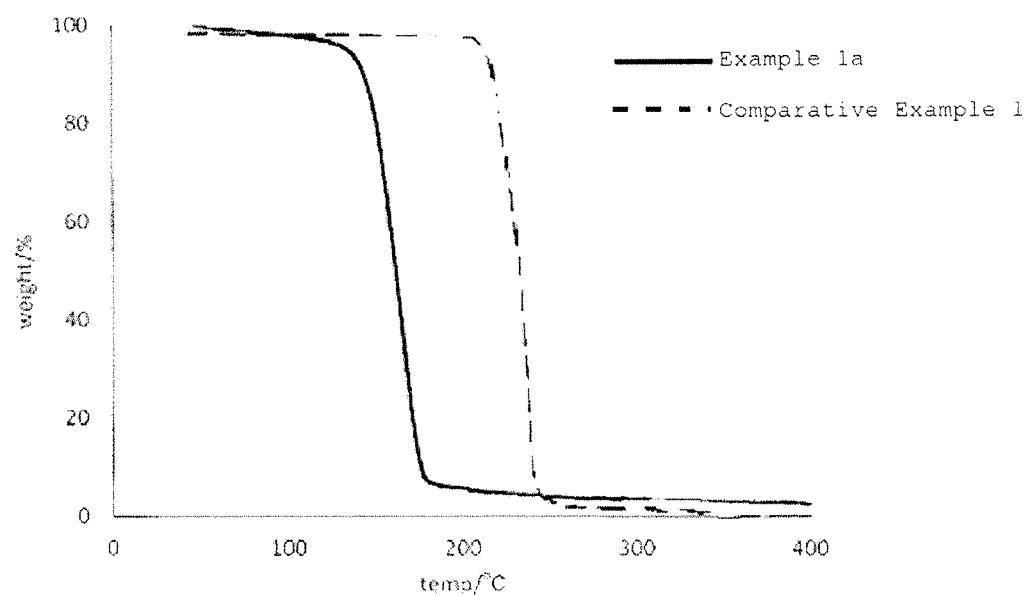

PYROLYTIC BINDER

TECHNICAL FIELD

The present invention relates to a thermally decomposable binder comprising an aliphatic polycarbonate resin and an inorganic fine particle-dispersed paste composition.

BACKGROUND ART

In recent years, inorganic fine particle-dispersed paste compositions comprising electroconductive particles, ceramics, glass, a phosphor, or other inorganic fine particles dispersed in a binder resin have been used for obtaining sintered bodies of various shapes. For example, a paste composition comprising fine metal particles dispersed as electroconductive particles has been used in the formation of circuits etc. on a substrate; a glass paste comprising dispersed glass and a phosphor paste comprising dispersed phosphor have been used in the production of plasma display panels; and a ceramic paste comprising dispersed ceramics has been molded into a green sheet, and then used in the production of a multilayer ceramic capacitor or the like.

Conventionally, ethyl cellulose, polyvinyl butyral, poly (methyl methacrylate), and the like have been used as binder resins. For these binder resins, the dewaxing temperature for removal by thermal decomposition is as high as 300° C. or higher, and the residual carbon is in a large amount, so that enormous energy is required in the production of a molded article. Further, when inorganic fine particles are handled, particularly when particles subject to reaction with oxygen are handled, dewaxing is preferably performed in a non-oxidative atmosphere, in which case the temperature required for dewaxing would be even higher. In view of the above, a binder resin is desired for which dewaxing can be performed at a lower temperature even in a non-oxidative atmosphere, as in an oxidative atmosphere.

In order to meet such demands, studies have been conducted with respect to a polycarbonate resin produced from carbon dioxide and an epoxide for use as a low-temperature decomposable binder, since this polycarbonate resin has a decomposition temperature as low as 200 to 250° C. even in a non-oxidative atmosphere. For example, Patent Literature (PTL) 1 discloses a metal paste composition in which a polypropylene carbonate, which is one of the aliphatic polycarbonates, is used as a binder, and similarly, PTL 2 discloses a ceramic paste, and PTL 3 discloses a glass paste, respectively.

CITATION LIST

Patent Literature

PTL 1: WO 2012/128028
PTL 2: JPH05-24934A
PTL 3: JP2011-178606A

Non-Patent Literature

NPL 1: RSC Adv., 2015, 5, 32092-32095

SUMMARY OF INVENTION

Technical Problem

However, there are increasing demands on the conservation of energy in recent years. Also, for example, when it is attempted to form a circuit by using a metal paste on a plastic substrate, there lies a problem to be solved; i.e., a plastic substrate has a heat-resistant temperature lower than the decomposition temperature of a binder resin, making it impossible to form a circuit.

Accordingly, an object of the present invention is to provide a thermally decomposable binder for which dewaxing can be performed at low temperatures, and to provide an inorganic fine particle-dispersed paste composition.

Solution to Problem

As a result of extensive research to achieve the above object, the present inventors found that an aliphatic polycarbonate resin comprising a specific constituent unit that has an amino group in the side chain exhibits decomposable properties at low temperatures. The inventors further conducted extensive research to find that when this aliphatic polycarbonate resin is used as a thermally decomposable binder, dewaxing can be sufficiently performed even at a sintering temperature of 160° C. or lower. The present invention has thus been completed.

Although an aliphatic polycarbonate having amino groups in side chains has already been synthesized by Pengfei Song et al. (Non-Patent Literature (NPL) 1), no report has been made regarding the thermal decomposition behaviors thereof.

The present invention encompasses, for example, the subject matter of the following items.

Item 1. A thermally decomposable binder comprising an aliphatic polycarbonate resin comprising a constituent unit represented by formula (1):

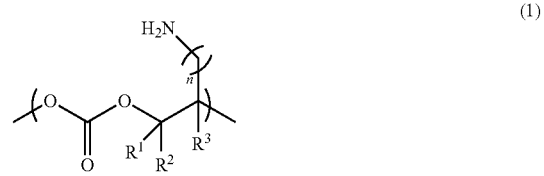

wherein
$R^1$, $R^2$, and $R^3$ are identical or different, and each represents a hydrogen atom, a substituted or unsubstituted alkyl group having 1 to 10 carbon atoms, or a substituted or unsubstituted aryl group having 6 to 20 carbon atoms, and
n is 1 or 2.

Item 2. The thermally decomposable binder according to Item 1, wherein the content of the constituent unit represented by formula (1) is 0.001 to 30 mol %, based on the entire constituent units constituting the aliphatic polycarbonate resin.

Item 3. The thermally decomposable binder according to Item 1 or 2, wherein the aliphatic polycarbonate resin further comprises a constituent unit represented by formula (2):

wherein

R⁴, R⁵, and R⁶ are identical or different, and each represents a hydrogen atom, a substituted or unsubstituted alkyl group having 1 to 10 carbon atoms, or a substituted or unsubstituted aryl group having 6 to 20 carbon atoms, wherein two groups from among R⁴ to R⁶, taken together with the carbon atom or carbon atoms to which these groups are attached, may form a substituted or unsubstituted, saturated or unsaturated aliphatic ring, and X represents a hydrogen atom, a linear or branched alkyl group having 1 to 10 carbon atoms, a haloalkyl group having 1 to 10 carbon atoms, a cycloalkyl group having 3 to 12 carbon atoms, an ether bond-containing group, an ester bond-containing group, or an allyl group.

Item 4. The thermally decomposable binder according to any one of Items 1 to 3, having a mass loss percentage of 90% or more after being maintained at 160° C. for 1 hour in a thermogravimetric analysis measurement.

Item 5. An inorganic fine particle-dispersed paste composition comprising:

an aliphatic polycarbonate resin comprising a constituent unit represented by formula (1):

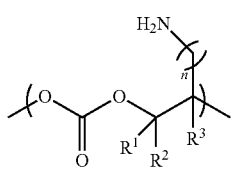

(1)

wherein

R¹, R², and R³ are identical or different, and each represents a hydrogen atom, a substituted or unsubstituted alkyl group having 1 to 10 carbon atoms, or a substituted or unsubstituted aryl group having 6 to 20 carbon atoms, and n is 1 or 2 (preferably the aliphatic polycarbonate resin of any one of Items 1 to 3);

inorganic fine particles; and a solvent.

Item 6. The inorganic fine particle-dispersed paste composition according to Item 5, wherein the aliphatic polycarbonate resin is present in an amount of 0.001 to 20 parts by mass, based on 100 parts by mass of the inorganic fine particles.

Item 7. The inorganic fine particle-dispersed paste composition according to Item 5 or 6, wherein the inorganic fine particles comprise at least one member selected from the group consisting of electroconductive particles, ceramic powders, glass powders, and inorganic phosphor fine particles.

Advantageous Effects of Invention

The thermally decomposable binder according to the present invention comprises, as an essential component, an aliphatic polycarbonate resin, which is thermally decomposable at low temperatures; thus, dewaxing can be performed at a low temperature. For this reason, effects are achieved, such that a substantial conservation of energy is possible, and sintering on a resin substrate having a low heat resistance is possible. In addition, the aliphatic polycarbonate resin can be subjected to dewaxing even in a non-oxidative atmosphere; thus, for example, an inorganic fine particle-dispersed paste comprising the aliphatic polycarbonate resin and inorganic fine particles can be subjected to dewaxing in a non-oxidative atmosphere.

BRIEF DESCRIPTION OF DRAWINGS

The FIGURE is a graph showing TG curves of the aliphatic polycarbonate resin obtained in Example 1a and the aliphatic polycarbonate resin obtained in Comparative Example 1.

DESCRIPTION OF EMBODIMENTS

The thermally decomposable binder according to the present invention comprises, as an essential component, an aliphatic polycarbonate resin comprising a constituent unit represented by the following formula (1) (may be referred to as "the aliphatic polycarbonate resin of the present invention").

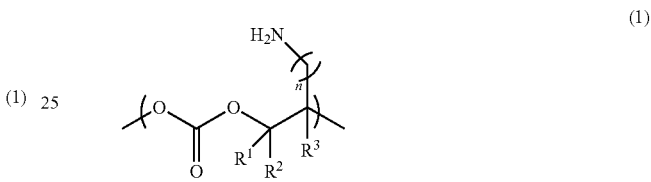

(1)

In the formula, R¹, R², and R³ are identical or different, and each represents a hydrogen atom, a substituted or unsubstituted alkyl group having 1 to 10 carbon atoms, or a substituted or unsubstituted aryl group having 6 to 20 carbon atoms, and n is 1 or 2. The constituent unit represented by formula (1) has an amino group attached to the methylene or ethylene group in the side chain, thus achieving decomposition of the aliphatic polycarbonate resin at a low temperature.

As stated above, R¹, R², and R³ are identical or different. Specifically, it is possible that R, R², and R³ are all identical, that R¹ and R² are identical while R³ is different, that R² and R³ are identical while R¹ is different, or that R, R², and R³ are all different.

The number of carbon atoms of the alkyl group represented by R¹, R², and R³ is 1 to 10 (1, 2, 3, 4, 5, 6, 7, 8, 9, or 10), and preferably 1 to 4. The alkyl group is preferably a linear or branched, substituted or unsubstituted alkyl group. Examples include a methyl group, an ethyl group, an n-propyl group, an isopropyl group, an n-butyl group, a sec-butyl group, a tert-butyl group, an n-pentyl group, an n-hexyl group, an n-heptyl group, an n-octyl group, an n-nonyl group, an n-decyl group, and the like. The alkyl group may be substituted with one or more substituents (e.g., 2, 3, or 4 substituents) selected from, for example, an alkoxy group, an ester group, a silyl group, a sulfanyl group, a cyano group, a nitro group, a sulfo group, a formyl group, an aryl group, a halogen atom, and the like. When the alkyl group is substituted with a substituent, the substituent is preferably attached to the terminal carbon of the alkyl group.

The number of carbon atoms of the aryl group represented by R, R², and R³ is 6 to 20 (6, 7, 8, 9, 10, 11, 12, 13, 14, 15, 16, 17, 18, 19, or 20), and preferably 6 to 14. Examples of the aryl group include a phenyl group, an indenyl group, a naphthyl group, a tetrahydronaphthyl group, and the like. The aryl group may be substituted with one or more substituents (e.g., 2, 3, or 4 substituents) selected from, for example, alkyl groups (e.g., a methyl group, an ethyl group, an n-propyl group, an isopropyl group, an n-butyl group, a sec-butyl group, and a tert-butyl group), other aryl groups (e.g., a phenyl group and a naphthyl group), an alkoxy group, an ester group, a silyl group, a sulfanyl group, a cyano group, a nitro group, a sulfo group, a formyl group, a halogen atom, and the like.

It is preferable that R, $R^2$, and $R^3$ above be identical or different, and each represent a hydrogen atom or an alkyl group having 1 to 4 carbon atoms (preferably an unsubstituted alkyl group having 1 to 4 carbon atoms). In particular, R, $R^2$, and $R^3$ each preferably represent a hydrogen atom.

The aliphatic polycarbonate resin of the present invention may consist only of the constituent unit represented by formula (1). However, in addition to the constituent unit represented by formula (1), the aliphatic polycarbonate resin of the present invention preferably also comprises a constituent unit represented by formula (2):

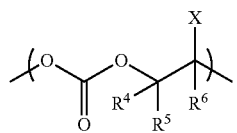

(2)

wherein $R^4$, $R^5$, and $R^6$ are identical or different, and each represents a hydrogen atom, a substituted or unsubstituted alkyl group having 1 to 10 carbon atoms, or a substituted or unsubstituted aryl group having 6 to 20 carbon atoms, wherein two groups from among $R^4$ to $R^6$, taken together with the carbon atom or carbon atoms to which these groups are attached, may form a substituted or unsubstituted, saturated or unsaturated aliphatic ring, and
X represents a hydrogen atom, an alkyl group having 1 to 10 carbon atoms, a haloalkyl group having 1 to 10 carbon atoms, a cycloalkyl group having 3 to 12 carbon atoms, an ether bond-containing group, an ester bond-containing group, or an allyl group.

As stated above, $R^4$, $R^5$, and $R^6$ are identical or different. Specifically, it is possible that $R^4$, $R^5$, and $R^6$ are all identical, that $R^4$ and $R^5$ are identical while $R^6$ is different, that $R^5$ and $R^6$ are identical while $R^4$ is different, or that $R^4$, $R^5$, and $R^6$ are all different.

The number of carbon atoms of the alkyl group represented by $R^4$, $R^5$, and $R^6$ is 1 to 10 (1, 2, 3, 4, 5, 6, 7, 8, 9, or 10), and preferably 1 to 4. The alkyl group is preferably a linear or branched, substituted or unsubstituted alkyl group. Examples include a methyl group, an ethyl group, an n-propyl group, an isopropyl group, an n-butyl group, a sec-butyl group, a tert-butyl group, an n-pentyl group, an n-hexyl group, an n-heptyl group, an n-octyl group, an n-nonyl group, an n-decyl group, and the like. The alkyl group may be substituted with one or more substituents (e.g., 2, 3, or 4 substituents) selected from, for example, an alkoxy group, an ester group, a silyl group, a sulfanyl group, a cyano group, a nitro group, a sulfo group, a formyl group, an aryl group, a halogen atom, and the like. When the alkyl group is substituted with a substituent, the substituent is preferably attached to the terminal carbon of the alkyl group.

The number of carbon atoms of the aryl group represented by $R^4$, $R^5$, and $R^6$ is 6 to 20 (6, 7, 8, 9, 10, 11, 12, 13, 14, 15, 16, 17, 18, 19, or 20), and preferably 6 to 14. Examples of the aryl group include a phenyl group, an indenyl group, a naphthyl group, a tetrahydronaphthyl group, and the like. The aryl group may be substituted with one or more substituents (e.g., 2, 3, or 4 substituents) selected from, for example, alkyl groups, such as a methyl group, an ethyl group, an n-propyl group, an isopropyl group, an n-butyl group, a sec-butyl group, and a tert-butyl group), other aryl groups, such as a phenyl group and a naphthyl group, an alkoxy group, an ester group, a silyl group, a sulfanyl group, a cyano group, a nitro group, a sulfo group, a formyl group, a halogen atom, and the like.

It is preferable that $R^4$, $R^5$, and $R^6$ above be identical or different, and each represent a hydrogen atom or an alkyl group having 1 to 4 carbon atoms (preferably an unsubstituted alkyl group having 1 to 4 carbon atoms). In particular, $R^4$, $R^5$, and $R^6$ each preferably represent a hydrogen atom.

X above represents a hydrogen atom, a linear or branched alkyl group having 1 to 10 (1, 2, 3, 4, 5, 6, 7, 8, 9, or 10) carbon atoms, a haloalkyl group having 1 to 10 (1, 2, 3, 4, 5, 6, 7, 8, 9, or 10) carbon atoms, a cycloalkyl group having 3 to 12 (3, 4, 5, 6, 7, 8, 9, 10, 11, or 12) carbon atoms, an ether bond-containing group, an ester bond-containing group, or an allyl group. X above is preferably a hydrogen atom or a linear or branched alkyl group having 1 to 4 carbon atoms, and more preferably a hydrogen atom or a methyl group.

The substituted or unsubstituted, saturated or unsaturated aliphatic ring formed by two groups from among the groups represented by $R^4$ to $R^6$, taken together with the carbon atom or carbon atoms to which these two groups are attached is preferably, for example, a 3- to 8-membered (3-, 4-, 5-, 6-, 7-, or 8-membered) aliphatic ring, and more preferably a 3- to 8-membered, unsubstituted, saturated or unsaturated aliphatic ring. More specifically, preferable examples include a cyclopentane ring, a cyclopentene ring, a cyclohexane ring, a cyclohexene ring, a cycloheptane ring, and the like.

The number of carbon atoms of the linear or branched alkyl group represented by X is 1 to 10, and preferably 1 to 4. Specific examples include a methyl group, an ethyl group, an n-propyl group, and the like.

The number of carbon atoms of the haloalkyl group is 1 to 10, and preferably 1 to 4. Examples of the haloalkyl group include a fluoromethyl group, a chloromethyl group, a bromomethyl group, an iodomethyl group, and the like.

The number of carbon atoms of the cycloalkyl group is 3 to 12, and preferably 5 to 10. Examples of the cycloalkyl group include a cyclopropyl group, a cyclobutyl group, a cyclopentyl group, a methylcyclopentyl group, a dimethylcyclopentyl group, a cyclohexyl group, a methylcyclohexyl group, a dimethylcyclohexyl group, a cycloheptyl group, and the like.

The ether bond-containing group is preferably an alkyl group having 1 to 4 (1, 2, 3, or 4) carbon atoms substituted with an alkoxy group having 1 to 4 (1, 2, 3, or 4) carbon atoms, an alkenyloxy group having 2 to 6 (2, 3, 4, 5, or 6) carbon atoms (e.g., an allyloxy group), an aryloxy group having 6 to 20 (6, 7, 8, 9, 10, 11, 12, 13, 14, 15, 16, 17, 18, 19, or 20) carbon atoms, a trialkylsilyloxy group (e.g., a trimethylsilyloxy group), and the like. More specific examples include a methoxymethyl group, an ethoxymethyl group, an allyloxymethyl group, and the like.

The ester bond-containing group is preferably an alkyl group having 1 to 4 (1, 2, 3, or 4) carbon atoms substituted with an acyloxy group having 1 to 4 (1, 2, 3, or 4) carbon atoms, a benzyloxycarboxy group, and the like. Examples include an acetoxymethyl group, a butyryloxymethyl group, and the like.

Of these, it is preferable that $R^4$, $R^5$, and $R^6$ be identical or different, and each preferably represent a hydrogen atom or an alkyl group having 1 to 4 (1, 2, 3, or 4) carbon atoms. In particular, $R^4$, $R^5$, and $R^6$ each preferably represent a hydrogen atom. Further, X is preferably an alkyl group having 1 to 4 (1, 2, 3, or 4) carbon atoms, and particularly preferably a methyl group or an ethyl group.

When the aliphatic polycarbonate resin of the present invention comprises the constituent unit represented by formula (2), in addition to the constituent unit represented by formula (1), it is preferable that $R^1$ and $R^4$ be identical, $R^2$ and $R^5$ be identical, or $R^3$ and $R^6$ be identical, and it is more preferable that $R^1$ and $R^4$ be identical, $R^2$ and $R^5$ be identical, and $R^3$ and $R^6$ be identical.

The aliphatic polycarbonate resin of the present invention may further comprise a constituent unit other than the constituent unit represented by formula (1) and the constituent unit represented by formula (2), to an extent that the effects of the present invention are not impaired. It is also possible that the aliphatic polycarbonate resin of the present invention consist only of the constituent unit represented by formula (1), or consist only of the constituent unit represented by formula (1) and the constituent unit represented by formula (2).

Examples of the method for producing the aliphatic polycarbonate resin of the present invention include a method comprising subjecting an epoxide and carbon dioxide to a polymerization reaction in the presence of a metal catalyst.

The epoxide usable for forming the constituent unit represented by formula (1) is preferably an epoxide in which the amino group is protected with a protecting group (e.g., an amide group having 1 to 10 (1, 2, 3, 4, 5, 6, 7, 8, 9, or 10) carbon atoms, a carbamate group having 1 to 10 (1, 2, 3, 4, 5, 6, 7, 8, 9, or 10) carbon atoms, a sulfonamide group having 1 to 10 (1, 2, 3, 4, 5, 6, 7, 8, 9, or 10) carbon atoms, and a benzyl group). More specifically, the epoxide is a compound represented by the following formula:

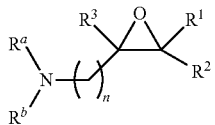

wherein $R^a$ and $R^b$ are identical or different, and each represents a hydrogen atom, —CO—$R^x$, —CO—O—$R^y$, —$SO_2$—$R^z$, a benzyl group, or a tosyl group, wherein $R^x$ is an alkyl group having 1 to 10 carbon atoms or a trifluoromethyl group, $R^y$ is an alkyl group having 1 to 10 carbon atoms, and $R^z$ is an alkyl group having 1 to 10 carbon atoms, with the proviso that either $R^a$ or $R^b$ is not a hydrogen atom, $R^1$, $R^2$, and $R^3$ are as defined above, and n is as defined above. The alkyl group having 1 to 10 (1, 2, 3, 4, 5, 6, 7, 8, 9, or 10) carbon atoms represented by $R^x$, $R^y$, and $R^z$ is a linear or branched alkyl group, and particularly preferably an alkyl group having 1 to 4 (1, 2, 3, or 4) carbon atoms.

More specific examples include N-oxiranylmethyl acetamide, N-oxiranylethyl acetamide, N-oxiranylmethyl trifluoroacetamide, N-oxiranylethyl trifluoroacetamide, N-oxiranylmethyl-methylcarbamate, N-oxiranylethyl-methylcarbamate, N-oxiranylmethyl-p-toluenesulfonamide, N-oxiranylethyl-p-toluenesulfonamide, N-oxiranylmethylbenzylamine, N-oxiranylethylbenzylamine, N-oxiranylmethyldibenzylamine, N-oxiranylethyldibenzylamine, and the like.

The epoxide mentioned above is copolymerized with carbon dioxide to give a precursor of an amino group-containing polycarbonate resin in which the amino group is protected, and then an appropriate deprotection reaction is performed to thus give an aliphatic polycarbonate resin comprising the constituent unit represented by formula (1). In particular, preferred is a method in which N-oxiranylmethyldibenzylamine or N-oxiranylethyldibenzylamine is used as the epoxide, and deprotection is carried out by a hydrogenation reaction or an oxidation reaction, from the viewpoint of ease in synthesis.

Examples of the epoxide usable for forming the constituent unit represented by formula (2) include ethylene oxide, propylene oxide, 1-butene oxide, 2-butene oxide, isobutylene oxide, 1-pentene oxide, 2-pentene oxide, 1-hexene oxide, 1-octene oxide, 1-dodecene oxide, cyclopentene oxide, cyclohexene oxide, styrene oxide, vinylcyclohexane oxide, 3-phenylpropylene oxide, 3,3,3-trifluoropropylene oxide, 3-naphthylpropylene oxide, 3-phenoxypropylene oxide, 3-naphthoxypropylene oxide, butadiene monoxide, 3-vinyloxypropylene oxide, 3-trimethylsilyloxypropylene oxide, and the like. Of these, ethylene oxide and propylene oxide are preferred from the viewpoint of having high reactivities.

Examples of the metal catalyst include zinc-based catalysts, aluminum-based catalysts, chromium-based catalysts, cobalt-based catalysts, and the like. Of these, zinc-based catalysts and cobalt-based catalysts are preferred because of having high polymerization activities in the polymerization reaction of an epoxide and carbon dioxide.

Examples of the zinc-based catalyst include organozinc catalysts, such as zinc acetate, diethylzinc, and dibutylzinc; organozinc catalysts obtainable by reacting a zinc compound with a compound such as a primary amine, a dihydric phenol (benzenediol), an aromatic dicarboxylic acid, an aromatic hydroxy acid, an aliphatic dicarboxylic acid, or an aliphatic monocarboxylic acid; and the like. Among these organozinc catalysts, organozinc catalysts obtainable by reacting a zinc compound, an aliphatic dicarboxylic acid, and an aliphatic monocarboxylic acid are preferred, and organozinc catalysts obtainable by reacting zinc oxide, glutaric acid, and acetic acid are more preferred, because of having even higher polymerization activities.

Examples of the cobalt-based catalyst include a cobalt complex represented by formula (3):

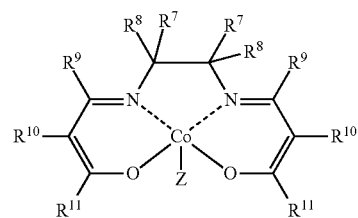

(3)

wherein $R^7$ and $R^8$ are identical or different, and each represents a hydrogen atom, a substituted or unsubstituted alkyl group, a substituted or unsubstituted aromatic group, or a substituted or unsubstituted aromatic heterocyclic ring group, or two $R^7$s or two $R^8$s taken together may form a substituted or unsubstituted, saturated or unsaturated aliphatic ring; $R^9$, $R^{10}$, and $R^{11}$ are identical or different, and each represents a hydrogen atom, a substituted or unsubstituted alkyl group, a substituted or unsubstituted alkenyl group, a substituted or unsubstituted aromatic group, a substituted or unsubstituted aromatic heterocyclic ring group, a substituted or unsubstituted alkoxy group, a substituted or unsubstituted acyl group, a substituted or unsubstituted alkoxycarbonyl group, a substituted or unsubstituted aromatic oxycarbonyl group, or a substituted or unsubstituted aralkyloxycarbonyl group, or $R^{10}$ and $R^{11}$ attached to adjacent carbon atoms taken together may form a substituted or unsubstituted aliphatic ring or a substituted or unsubstituted aromatic ring; and Z is an anionic ligand selected from the group consisting of $F^-$, $Cl^-$, $Br^-$, $I^-$, $N_3^-$, $CF_3SO_3^-$, p-$CH_3C_6H_4SO_3^-$, $BF_4^-$, $NO_2^-$, $NO_3^-$, $OH^-$, $PF_6^-$, $BPh_4^-$, $SbF_6^-$, $ClO_4^-$, $OTf^-$, $OTs^-$, an aliphatic carboxylate, an aromatic carboxylate, an alkoxide, and an aromatic oxide.

Among the cobalt complexes represented by formula (3), preferred is a cobalt complex represented by formula (4):

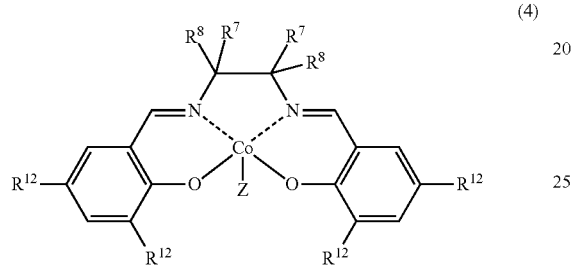

(4)

wherein $R^7$ and $R^8$ are identical or different, and each represents a hydrogen atom, a substituted or unsubstituted alkyl group, a substituted or unsubstituted aromatic group, or a substituted or unsubstituted aromatic heterocyclic group, or two $R^7$s or two $R^8$s taken together may form a substituted or unsubstituted, saturated or unsaturated aliphatic ring; each $R^{12}$ is independently a hydrogen atom, an alkyl group having 1 to 6 carbon atoms, an alkoxy group having 1 to 6 carbon atoms, a substituted or unsubstituted aromatic group, or a halogen atom; and Z is an anionic ligand selected from the group consisting of $F^-$, $Cl^-$, $Br^-$, $I^-$, $N_3^-$, $CF_3SO_3^-$, p-$CH_3C_6H_4SO_3^-$, $BF_4^-$, $NO_2^-$, $NO_3^-$, $OH^-$, $PF_6^-$, $BPh_4^-$, $SbF_6^-$, $ClO_4^-$, $OTf^-$, $OTs^-$, an aliphatic carboxylate, an aromatic carboxylate, an alkoxide, and an aromatic oxide.

Among the cobalt complexes represented by formula (4), specific preferred examples include cobalt complexes represented by the following formulae (4-1) to (4-5).

(4-1)

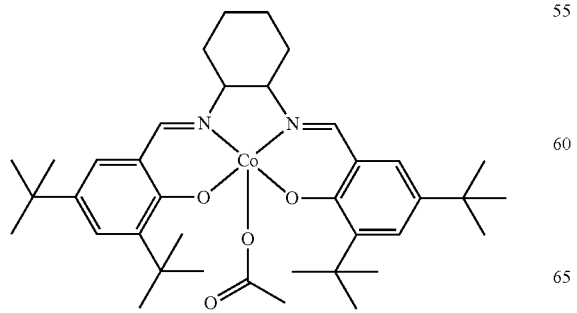

(4-2)

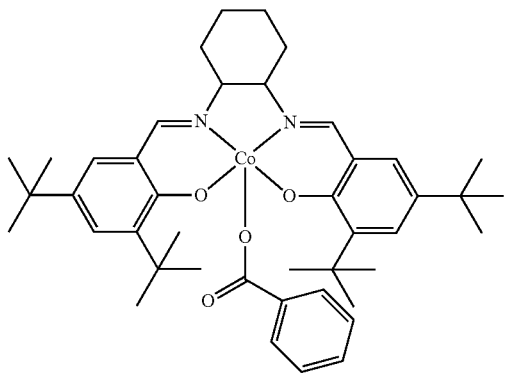

(4-3)

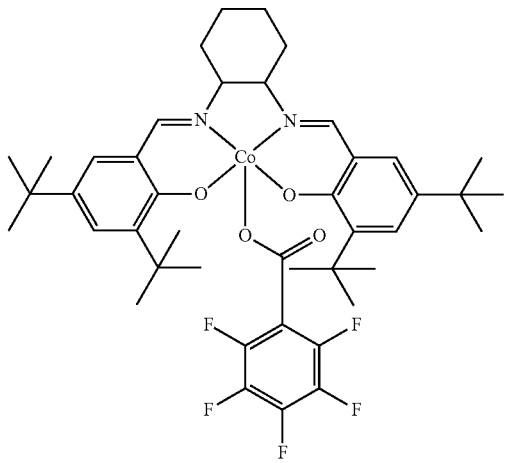

(4-4)

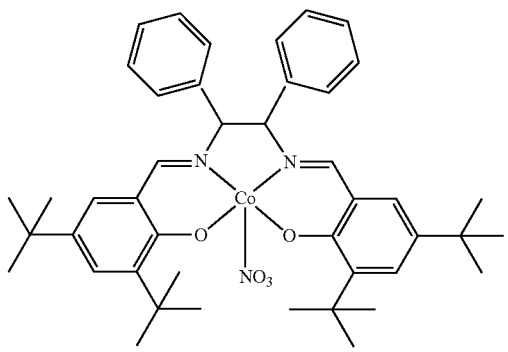

(4-5)

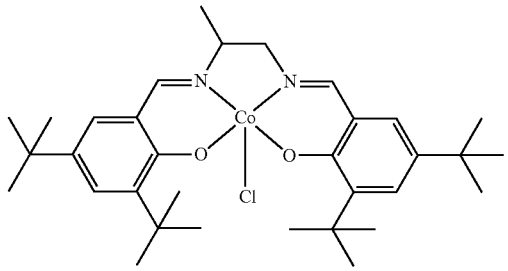

The amount of the metal catalyst used in the polymerization reaction is preferably 0.001 parts by mass or more, and more preferably 0.01 parts by mass or more, based on 100 parts by mass of the epoxide, from the viewpoint of accelerating the progress of the polymerization reaction. Further, the amount is preferably 20 parts by mass or less, and more preferably 10 parts by mass or less, based on 100 parts by mass of the epoxide, from the viewpoint of obtaining the effects that measure up the amount used.

The above polymerization reaction may be carried out optionally in the presence of a cocatalyst, in addition to the metal catalyst. Examples of the cocatalyst include bis(triphenylphosphoranylidene) ammonium chloride (PPNCl), piperidine, bis(triphenylphosphoranylidene) ammonium fluoride (PPNF), bis(triphenylphosphoranylidene) ammonium pentafluorobenzoate (PPNOBzFs), tetra-n-butylammonium chloride (nBu$_4$NCl), tetra-n-butylammonium bromide (nBu$_4$NBr), tetra-n-butylammonium iodide (nBu$_4$NI), tetra-n-butylammonium acetate (nBu$_4$NOAc), tetra-n-butylammonium nitrate (nBu$_4$NO$_3$), triethyl phosphine (Et$_3$P), tri-n-butyl phosphine (nBu$_3$P), triphenyl phosphine (Ph$_3$P), pyridine, 4-methylpyridine, 4-formylpyridine, 4-(N,N-dimethylamino)pyridine, N-methylimidazole, N-ethylimidazole, N-propylimidazole, and the like. Among these, PPNCl, PPNF, PPNOBzFs, and nBu$_4$NCl are preferred, and PPNCl and PPNF are more preferred, from the viewpoint of having high reaction activities.

The amount of the cocatalyst used is preferably 0.1 to 10 mol, more preferably 0.3 to 5 mol, and even more preferably 0.5 to 1.5 mol, based on one mole of the metal catalyst.

In the above polymerization reaction, a reaction solvent may be optionally used. Various organic solvents can be used as the reaction solvent. Examples of the organic solvent include aliphatic hydrocarbon-based solvents, such as pentane, hexane, octane, decane, and cyclohexane; aromatic hydrocarbon-based solvents, such as benzene, toluene, and xylene; halogenated hydrocarbon-based solvents, such as methylene chloride, chloroform, carbon tetrachloride, 1,1-dichloroethane, 1,2-dichloroethane, ethyl chloride, trichloroethane, 1-chloropropane, 2-chloropropane, 1-chlorobutane, 2-chlorobutane, 1-chloro-2-methylpropane, chlorobenzene, and bromobenzene; ether-based solvents, such as dimethoxyethane, tetrahydrofuran, 2-methyltetrahydrofuran, 1,4-dioxane, and 1,3-dioxolane; ester-based solvents, such as ethyl acetate, n-propyl acetate, and isopropyl acetate; amide-based solvents, such as N,N-dimethylformamide and N,N-dimethylacetamide; carbonate-based solvents, such as dimethyl carbonate, ethyl methyl carbonate, diethyl carbonate, and propylene carbonate; and the like.

The amount of the reaction solvent used is preferably from 100 to 10000 parts by mass, based on 100 parts by mass of the epoxide, to allow the reaction to smoothly proceed.

Examples of the method for carrying out a polymerization reaction of an epoxide and carbon dioxide in the presence of a metal catalyst include, but are not particularly limited to, a method comprising charging an autoclave with an epoxide, a metal catalyst, and optionally a cocatalyst, a reaction solvent, and the like, mixing the contents, and pressurizing the autoclave with carbon dioxide to allow a reaction to proceed.

The amount of carbon dioxide used in the above polymerization reaction is preferably 1 to 10 mol, more preferably 1 to 5 mol, and even more preferably 1 to 3 mol, based on one mole of the epoxide.

The pressure of carbon dioxide in the polymerization reaction is preferably 0.1 MPa or more, more preferably 0.2 MPa or more, and even more preferably 0.5 MPa or more, to allow the reaction to smoothly proceed. Further, the pressure is preferably 20 MPa or less, more preferably 10 MPa or less, and even more preferably 5 MPa or less, from the viewpoint of obtaining effects that measure up to the pressure used.

The polymerization reaction temperature in the polymerization reaction is preferably 0° C. or higher, more preferably 10° C. or higher, and even more preferably 20° C. or higher, from the viewpoint of shortening the reaction time. Further, the polymerization reaction temperature is preferably 100° C. or lower, more preferably 90° C. or lower, and even more preferably 80° C. or lower, from the viewpoint of controlling side reactions, thereby increasing the yields.

The polymerization reaction time cannot be unconditionally determined because the polymerization reaction time differs depending upon the polymerization reaction conditions. The polymerization reaction time is usually preferably about 1 to 40 hours.

The following describes one embodiment of an example of a preferred method for synthesizing the aliphatic polycarbonate resin of the present invention.

The epoxide usable for forming the constituent unit represented by formula (1) may be produced, for example, by the method shown in the following Reaction Scheme 1.

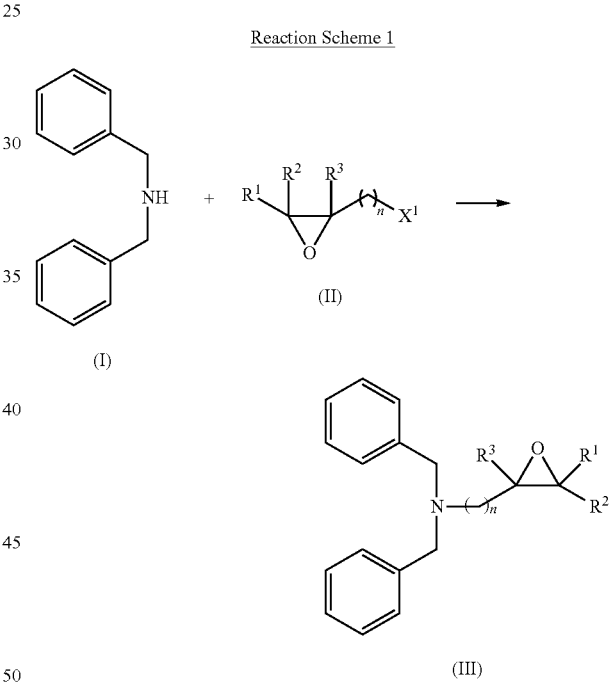

In the scheme, $X^1$ represents a halogen atom, $R^1$, $R^2$, and $R^3$ are as defined above, and n is as defined above.

The compound (dibenzylamine) represented by formula (I) is reacted with a compound represented by formula (II) to produce a compound represented by formula (III). (For example, when $R^1$, $R^2$, and $R^3$ each represent a hydrogen atom, then N-oxiranylmethyldibenzylamine or N-oxiranylethyldibenzylamine can be produced.) Hereinafter, the compound represented by formula (I) or the like may be referred to as "the compound (I)" or the like. In this embodiment, although dibenzylamine is used as the compound (I), it is possible to use, instead of dibenzylamine, a compound in which the benzyl groups of dibenzylamine are replaced with $R^a$ and $R^b$ (i.e., $R^a$—NH—$R^b$; $R^a$ and $R^b$ are as defined above). In this case, in the reaction scheme shown below as well, a compound in which the benzyl groups are replaced with $R^a$ and $R^b$ can be produced.

$X^1$ represents a halogen atom, and preferably represents a chlorine atom or a bromine atom.

This reaction is generally performed in an appropriate solvent in the presence or absence of a basic compound. To allow the reaction to smoothly proceed, the reaction is preferably performed in the presence of a basic compound.

Examples of the solvent include N,N-dimethylformamide (DMF), dimethylsulfoxide (DMSO), tetrahydrofuran (THF), and the like.

The amount of the compound (II) used is usually at least 1 mol or more, and preferably 1 to 5 mol, based on one mole of dibenzylamine.

As the basic compound, known organic and inorganic bases can be widely used, with inorganic bases being preferable. Examples of usable basic compounds include metal carbonates, such as sodium carbonate, potassium carbonate, sodium hydrogen carbonate, potassium hydrogen carbonate, and cesium carbonate.

The amount of the basic compound, when used, is usually at least 1 mol or more, and preferably 1 to 5 mol, based on one mole of dibenzylamine.

The reaction usually suitably proceeds at about 0 to 70° C. (preferably ordinary temperature), and the reaction is usually completed in about 10 to 100 hours.

The produced compound (III) can be purified using a known method (e.g., chromatography, preferably silica column chromatography).

The compound (III) is reacted (polymerized) with a compound (IV) and carbon dioxide to produce a compound (V), which is an aliphatic polycarbonate.

As described above, this reaction can be performed in the presence of a metal catalyst. Further, to allow the reaction to smoothly proceed, it is possible to use a solvent.

The metal catalyst used here is as mentioned above. When a solvent is used, examples include aromatic hydrocarbon-based solvents, such as benzene, toluene, and xylene; ether-based solvents, such as diethyl ether, tetrahydrofuran, and dioxane; carbonate solvents, such as dimethyl carbonate, diethyl carbonate, and propylene carbonate; and acetonitrile, dimethylformamide, dimethylsulfoxide, hexamethylphosphoric triamide, and the like.

Since water may adversely affect the reaction, it is preferable to remove as much water as possible from the reaction system.

The amount of the compound (IV) used is at least 1 mol or more, preferably 1 to 50 mol, and more preferably 10 to 40 mol, based on one mole of the compound (III). It is preferable to use an excess of carbon dioxide, relative to both of these compounds.

This reaction usually suitably proceeds at about 20 to 70° C. (preferably 30 to 50° C.), and the reaction is usually completed in about 12 to 48 hours. The reaction is preferably performed under high pressure. For example, the reaction is preferably performed under pressure as high as about 0.5 to 20 MPa, and more preferably about 1 to 10 MPa. For example, the pressure can be increased by introducing carbon dioxide to a reactor. As the reactor, for example, an autoclave is preferably used.

Further, the obtained compound (V) can be precipitated using a known method (e.g., a reprecipitation method).

Reaction Scheme 2

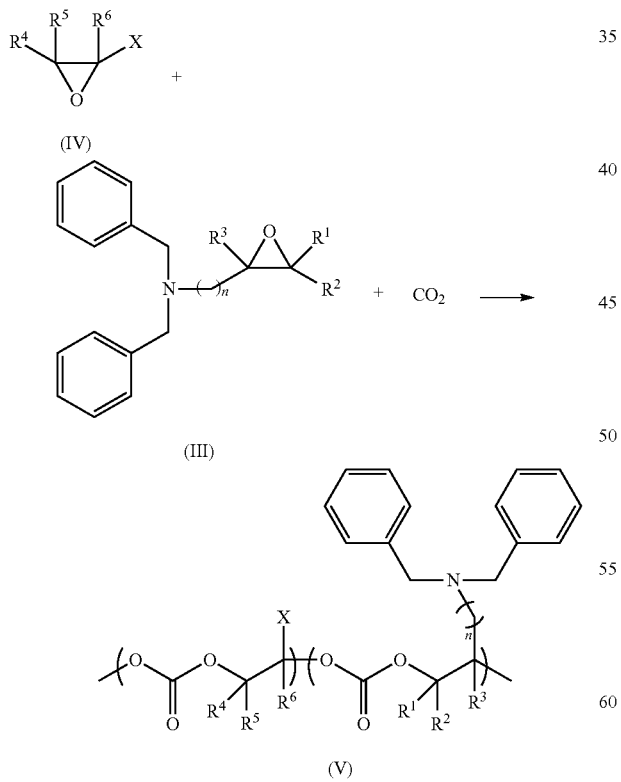

Reaction Scheme 3

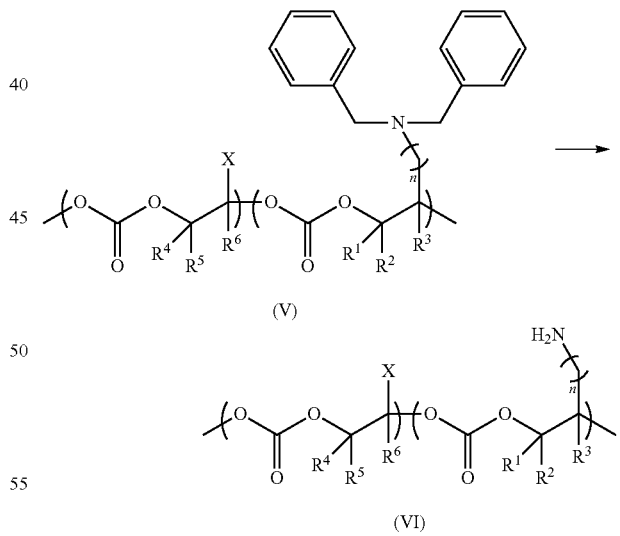

In the scheme, $R^1$, $R^2$, and $R^3$ are as defined above, $R^4$, $R^5$, and $R^6$ are as defined above, X is as defined above, and n is as defined above.

In the reaction scheme, $R^1$, $R^2$, and $R^3$ are as defined above, $R^4$, $R^5$, and $R^6$ are as defined above, X is as defined above, and n is as defined above.

The amino group-protecting group (the benzyl group) is removed from the compound (V) to obtain a compound (VI). The compound (VI) is a preferable example of the aliphatic polycarbonate resin of the present invention. As described above, the deprotection above can be performed by a hydrogenation reaction or oxidation reaction. Preferred is a hydrogenation reaction (i.e., hydrogenolysis reaction). This reaction can be performed using, for example, palladium carbon as a catalyst, and adding hydrogen gas to the reaction system. The reaction can usually be performed at about 10 to 60° C. and, for example, at a hydrogen gas pressure of 1 to 20 atms. The reaction is usually performed for about 10 to 100 hours.

The aliphatic polycarbonate resin of the present invention preferably has a number average molecular weight of 3,000 to 1,000,000. The number average molecular weight is preferably 3,000 or more, and more preferably 10,000 or more. This is to avoid a reduction in dispersibility of inorganic fine particles in a paste composition prepared by mixing the aliphatic polycarbonate resin with inorganic fine particles; the reduction in dispersibility of the inorganic fine particles causes localization of the inorganic fine particles in molding and thus deteriorates the performance of resulting sintered bodies. The number average molecular weight is preferably 1,000,000 or less, more preferably 500,000 or less, and even more preferably 300,000 or less, from the viewpoint of avoiding the lowering of the handling property due to the lowering of the solubility of the aliphatic polycarbonate resin in a solvent. The number average molecular weight is particularly preferably 10,000 to 300,000, and more preferably 20,000 to 100,000.

The number average molecular weight of aliphatic polycarbonate resin is measured by preparing a chloroform solution having an aliphatic polycarbonate resin concentration of 0.5 mass %, and using high-performance liquid chromatography. After measurement, the number average molecular weight of the aliphatic polycarbonate resin is determined by comparison with polystyrene with known number average molecular weight measured under the same conditions. When the aliphatic polycarbonate resin used is an aliphatic polycarbonate resin whose amino group is protected with a protecting group, the number average molecular weight of the amino group-containing aliphatic polycarbonate resin can be determined, based on the percentage of the constituent unit containing the protecting group in the resin and the molecular weight of the constituent unit. The measurement conditions are as follows:

Column: GPC column
Column temperature: 40° C.
Eluate: Chloroform
Flow rate: 1.0 mL/min As described earlier, the aliphatic polycarbonate resin of the present invention has an amino group attached to the methylene or ethylene group in the side chain, and has a relatively low thermal decomposition temperature. The aliphatic polycarbonate resin of the present invention has a mass loss percentage of preferably 90% or more, more preferably 95% or more, and even more preferably 99% or more, after being maintained at 160° C. for 1 hour in a thermogravimetric analysis measurement. Further, the mass loss percentage after being maintained at 100° C. for 1 hour in a thermogravimetric analysis measurement is preferably 5% or less, more preferably 3% or less, and even more preferably 1% or less, from the viewpoint of inhibiting decomposition by heating during the process before the decomposition step. The thermal decomposition temperature can be adjusted by varying the content (content percentage) of the constituent unit represented by formula (1).

The thermogravimetric analysis measurement is performed using a thermogravimetric analysis measurement device (e.g., TG/DTA7220 produced by Hitachi High-Tech Science). The temperature is increased from room temperature to a given temperature (160° C.) at a heating rate of 50° C./min in a nitrogen atmosphere, and the temperature is maintained for 1 hour, followed by the measurement of thermal decomposition behaviors. The mass loss percentage is obtained by reading off the mass (W1) after one-hour heating from the decomposition curve, and calculating the ratio relative to the initial mass (W0), i.e., [(W0−W1)/W0× 100].

The content of the constituent unit represented by formula (1) in the aliphatic polycarbonate resin of the present invention is preferably 30% by mole or less, more preferably 20% by mole or less, and even more preferably 10% by mole or less, based on the entire constituent units constituting the aliphatic polycarbonate resin, from the viewpoint of reducing the residual carbon after thermal decomposition. Further, the content is preferably 0.001% by mole or more, more preferably 0.1% by mole or more, even more preferably 0.5% by mole or more, still even more preferably 1.0% by mole or more, from the viewpoint of lowering the decomposition temperature. From the above viewpoints, the content of the constituent unit represented by formula (1) is preferably 0.001 to 30% by mole, more preferably 0.1 to 20% by mole, even more preferably 0.5 to 20% by mole, and still even more preferably 1.0 to 10% by mole, based on the entire constituent units constituting the aliphatic polycarbonate resin. The content of the constituent unit represented by formula (1) can be determined by the method stated in the section "Content of Constituent Unit Represented by Formula (1) in Aliphatic Polycarbonate Resin" in the Examples. More specifically, the content is determined as follows.

The compositional ratio of the constituent units in the resin is analyzed by 1H-NMR, and the amino group content in the aliphatic polycarbonate resin is determined as the content of the constituent unit represented by formula (1).

The aliphatic polycarbonate resin is subjected to $^1$H-NMR measurement in deuterated chloroform at 25° C. Then, an integral value (A) of the peak appeared near 5.0 ppm, ascribed to the methine group adjacently attached to the carbonate group and an integral value (B) of the peak appeared near 2.4 ppm, ascribed to the methylene group adjacently attached to the amino group are determined, and the amino group content is calculated using the following calculation formula.

Amino group content (% by mole)=$B/(2 \times A) \times 100$

If the amino group content is small, calculation using the above method could be difficult. In this case, assuming that the amount of amino group would not change in the step of obtaining an amino group-containing polycarbonate resin from an amino group-containing polycarbonate resin precursor whose amino group is protected, the precursor is subjected to $^1$H-NMR measurement in deuterated chloroform at 25° C., and an integral value (C) of peaks ascribed to groups containing a protective group and an integral value (D) of peaks ascribed to groups contained in constituent units not containing a protective group are determined to calculate the amino group content using the following calculation formula. For example, in the case of Example 1 (i.e., when the protecting group is a benzyl group), the integral value (C) of the peak appeared near 3.7 to 3.5 ppm, ascribed to the methylene group adjacently attached to the phenyl group and the integral value (D) of the peak appeared near 1.4 to 1.3 ppm, ascribed to the methyl group are used.

Amino group content (% by mole)=$3 \times C/(3 \times C+4 \times D) \times 100$

The initial thermal decomposition temperature of the aliphatic polycarbonate resin of the present invention is preferably 80° C. or higher, more preferably 100° C. or higher, and even more preferably 120° C. or higher, from the viewpoint of inhibiting decomposition by heating during the process before the decomposition step. The initial thermal decomposition temperature is preferably 160° C. or lower, more preferably 155° C. or lower, and even more preferably 150° C. or lower, from the viewpoint of shortening the heating time for subjecting the resin to the decomposition step.

The aliphatic polycarbonate resin of the present invention, which achieves a reduced residual carbon after sintering, and which can be subjected to a dewaxing treatment at a temperature of 160° C. or lower, is useful as a binder resin used in the production of a molded article. By using the aliphatic polycarbonate resin of the present invention, not only is a great conservation of energy made possible in the dewaxing step (the step of decomposition by heating), but also application to substrates not having a very high heat resistance is made possible.

The thermally decomposable binder of the present invention may be the aliphatic polycarbonate resin of the present invention as is. Alternatively, for example, the thermally decomposable binder of the present invention may be produced by dissolving the aliphatic polycarbonate resin of the present invention in a solvent that is capable of dissolving the aliphatic polycarbonate resin of the present invention. Moreover, as described below, the thermally decomposable binder of the present invention may comprise other aliphatic polycarbonate resin(s), in addition to the aliphatic polycarbonate resin of the present invention.

Examples of solvents that are capable of dissolving the aliphatic polycarbonate resin include toluene, ethyl acetate, butyl acetate, isopropyl alcohol, methyl isobutyl ketone, methyl ethyl ketone, N-methyl-2-pyrrolidone, ethylene glycol ethyl ether, ethylene glycol monobutyl ether, ethylene glycol monoethyl ether acetate, diethylene glycol monoethyl ether, diethylene glycol monomethyl ether, diethylene glycol monoisobutyl ether, trimethyl pentanediol monoisobutyrate, ethyl carbitol, butyl carbitol, ethyl carbitol acetate, butyl carbitol acetate, terpineol, terpineol acetate, dihydro terpineol, dihydro terpineol acetate, texanol, isophorone, butyl lactate, dioctyl phthalate, dioctyl adipate, benzyl alcohol, phenylpropylene glycol, cresol, N,N-dimethylformamide, propylene carbonate, and the like. Of these, N-methyl-2-pyrrolidone, terpineol, terpineol acetate, ethyl carbitol acetate, butyl carbitol acetate, texanol, and propylene carbonate are preferable, because they have a moderately high boiling point and are likely to be uniformly volatilized during sintering. These organic solvents may be used singly or in a combination of two or more.

The amount of the solvent contained in the thermally decomposable binder of the present invention is preferably 100 to 2000 parts by mass, more preferably 200 to 1500 parts by mass, and even more preferably 300 to 1000 parts by mass, based on 100 parts by mass of the aliphatic polycarbonate resin (when other aliphatic polycarbonate resin(s) are also contained in addition to the aliphatic polycarbonate resin of the present invention, then the total of all of the aliphatic polycarbonate resins), from the viewpoint of ease in handling the binder to be obtained.

The aliphatic polycarbonate resin of the present invention can be used by mixing with inorganic fine particles. The aliphatic polycarbonate resin of the present invention can be subjected to dewaxing even in a non-oxidizing atmosphere; therefore, the aliphatic polycarbonate resin of the present invention is suitably used by mixing with inorganic fine particles, for which dewaxing is preferably performed in a non-oxidizing atmosphere to prevent reaction with oxygen.

Accordingly, the present invention further provides an inorganic fine particle-dispersed paste composition comprising the aliphatic polycarbonate resin of the present invention. In the paste composition, the aliphatic polycarbonate resin preferably serves as a binder resin.

The thermally decomposable binder and inorganic fine particle-dispersed paste composition according to the present invention may also comprise other aliphatic polycarbonate resin(s) (i.e., aliphatic polycarbonate resins that do not contain the constituent unit represented by formula (1)), in addition to the aliphatic polycarbonate resin of the present invention. Examples of the other aliphatic polycarbonate resins include an aliphatic polycarbonate resin that contains the constituent unit represented by formula (2), and does not contain the constituent unit represented by formula (1); an aliphatic polycarbonate resin that consists only of the constituent unit represented by formula (2); and the like. Examples particularly include polytrimethylene carbonate resins, polytetramethylene carbonate resins, poly(1,4-cyclohexanedimethylene)carbonate resins, and the like. One or two or more kinds of these other aliphatic polycarbonate resins may be used in combination with the aliphatic polycarbonate resin of the present invention.

The content of the constituent unit represented by formula (1) in the entire constituent units constituting the aliphatic polycarbonate resin contained in the thermally decomposable binder or the inorganic fine particle-dispersed paste composition is preferably within the range that is stated above as the content of the constituent unit represented by formula (1) in the aliphatic polycarbonate resin of the present invention. More specifically, the content of the constituent unit represented by formula (1) in the entire constituent units constituting the aliphatic polycarbonate resin contained in the thermally decomposable binder or the inorganic fine particle-dispersed paste composition is preferably 30% by mole or less, more preferably 20% by mole or less, and still more preferably 10% by mole or less, from the viewpoint of reducing the residual carbon after thermal decomposition. The content is preferably 0.001% by mole or more, more preferably 0.1% by mole or more, even more preferably 0.5% by mole or more, and still even more preferably 1.0% by mole or more, from the viewpoint of lowering the decomposition temperature. In view of the above viewpoints, the content is preferably 0.001 to 30% by mole, more preferably 0.1 to 20% by mole, even more preferably 0.5 to 20% by mole, and still even more preferably 1.0 to 10% by mole.

For example, when the thermally decomposable binder comprises only the aliphatic polycarbonate resin of the present invention as an aliphatic polycarbonate resin, the content of the constituent unit represented by formula (1) in the aliphatic polycarbonate resin of the present invention is preferably within the above range.

Further, when the thermally decomposable binder comprises the aliphatic polycarbonate resin of the present invention and other aliphatic polycarbonate resin(s), the content of the constituent unit represented by formula (1) in the entire constituent units of these aliphatic polycarbonate resins contained in the thermally decomposable binder is preferably within the above range.

The same applies to cases where the inorganic fine particle-dispersed paste composition comprises only the aliphatic polycarbonate resin of the present invention as an aliphatic polycarbonate resin, and where the inorganic fine particle-dispersed paste composition comprises the aliphatic polycarbonate resin of the present invention and other aliphatic polycarbonate resin(s).

The inorganic fine particle-dispersed paste composition of the present invention comprises the aliphatic polycarbonate resin of the present invention, inorganic fine particles, and a solvent.

The inorganic fine particles are preferably at least one member selected from the group consisting of electroconductive particles, ceramic powders, glass powders, and inorganic phosphor fine particles.

Examples of the electroconductive particles include metal particles made of, for example, copper, iron, nickel, palladium, platinum, gold, silver, aluminum, tungsten, alloys thereof, and the like.

Examples of the glass powders include glass powders made of, for example, various silicon oxides, such as CaO—$Al_2O_3$—$SiO_2$ system, MgO—$Al_2O_3$—$SiO_2$ system, and $LiO_2$—$Al_2O_3$—$SiO_2$ system; powders of bismuth oxide glass, silicate glass, lead glass, zinc glass, boron glass, and the like; and the like.

Examples of the glass powders also include glass powders made of a PbO—$B_2O_3$—$SiO_2$ mixture, a BaO—ZnO—$B_2O_3$—$SiO_2$ mixture, a ZnO—$Bi_2O_3$—$B_2O_3$—$SiO_2$ mixture, a $Bi_2O_3$—$B_2O_3$—BaO—CuO mixture, a $Bi_2O_3$—ZnO—$B_2O_3$—$Al_2O_3$—SrO mixture, a ZnO—$Bi_2O_3$—$B_2O_3$ mixture, a $Bi_2O_3$—$SiO_2$ mixture, a $P_2O_5$—$Na_2O$—CaO—BaO—$Al_2O_3$—$B_2O_3$ mixture, $P_2O_5$—SnO mixture, a $P_2O_5$—SnO—$B_2O_3$ mixture, a $P_2O_5$—SnO—$SiO_2$ mixture, a CuO—$P_2O_5$—RO mixture, an $SiO_2$—$B_2O_3$—ZnO—$Na_2O$—$Li_2O$—NaF—$V_2O_5$ mixture, a $P_2O_5$—ZnO—SnO—$R_2O$—RO mixture, a $B_2O_3$—$SiO_2$—ZnO mixture, a $B_2O_3$—$SiO_2$—$Al_2O_3$—$ZrO_2$ mixture, an $SiO_2$—$B_2O_3$—ZnO—$R_2O$—RO mixture, an $SiO_2$—$B_2O_3$—$Al_2O_3$—RO—$R_2O$ mixture, an SrO—ZnO—$P_2O_5$ mixture, an SrO—ZnO—$P_2O_5$ mixture, a BaO—ZnO—$B_2O_3$—$SiO_2$ mixture, and the like. Here, R represents an element selected from the group consisting of Zn, Ba, Ca, Mg, Sr, Sn, Ni, Fe, and Mn.

Examples of the ceramic powders include powders of alumina, zirconia, titanium oxide, barium titanate, alumina nitride, silicon nitride, boron nitride, silicon carbide, and the like. In addition, nano-ITO (tin-doped indium oxide) usable in transparent electrode materials, nano-titanium oxide usable in dye sensitized solar cells, and the like can also be suitably used.

Examples of the phosphor fine particles include $BaMgAl_{10}O_{17}$:Eu, $Zn_2SiO_4$:Mn, (Y,Gd)$BO_3$:Eu, and the like.

The content of the aliphatic polycarbonate resin in the inorganic fine particle-dispersed paste composition is preferably 0.001 parts by mass or more, more preferably 0.01 parts by mass or more, and even more preferably 0.1 parts by mass or more, based on 100 parts by mass of the inorganic fine particles, from the viewpoint of avoiding a reduction in dispersibility of the inorganic fine particles, whereby avoiding localization of the inorganic fine particles in molding, since the localization of the inorganic fine particles in molding deteriorates the performance of the resulting sintered bodies. The content is preferably 20 parts by mass or less, more preferably 15 parts by mass or less, and even more preferably 10 parts by mass or less, from the viewpoint of reducing the formation of a decomposed product by excessive decomposition of the aliphatic polycarbonate resin when sintering the inorganic fine particle-dispersed paste composition, thereby obtaining a close-packed sintered body. The content of the aliphatic polycarbonate resin as used herein does not only refer to the content of the aliphatic polycarbonate resin of the present invention, but also refers to the total content of two or more aliphatic polycarbonate resins if used in combination.

As the solvent, the same solvents as those usable in the thermally decomposable binder are preferred.

The content of the solvent in the inorganic fine particle-dispersed paste composition is preferably 0.001 parts by mass or more, more preferably 0.01 parts by mass or more, and even more preferably 0.1 parts by mass or more, based on 100 parts by mass of the inorganic fine particles, from the viewpoint of the dispersibility of the inorganic fine particles. The content is preferably 100 parts by mass or less, more preferably 80 parts by mass or less, and even more preferably 50 parts by mass or less, from the viewpoint of adjusting the viscosity of the inorganic fine particle-dispersed paste composition.

The content of the inorganic fine particles in the inorganic fine particle-dispersed paste composition of the present invention is preferably 10 to 90% by mass, and more preferably 40 to 80% by mass.

The inorganic fine particle-dispersed paste composition of the present invention may optionally further comprise additives.

Examples of the additives include adhesion accelerators, surfactants, plasticizers, storage stabilizers, defoaming agents, and the like.

Examples of the adhesion accelerators include amine-based silane coupling agents, glycidyl-based silane coupling agents, and the like. Examples of the surfactants include polyoxyethylene-based surfactants, fatty acid ester-based surfactants, and the like. Examples of the plasticizers include polyether-polyols, phthalate esters, and the like. Examples of the storage stabilizers include amine compounds, carboxylic acid compounds, phosphorus compounds, sulfur compounds, triazole-based compounds, and the like. Examples of the defoaming agents include hydrophobic silicas, polyalkylene derivatives, polyether derivatives, and the like.

The content of the additives in the inorganic fine particle-dispersed paste composition is preferably 50 parts by mass or less, and more preferably 30 parts by mass or less, based on 100 parts by mass of the inorganic fine particles.

Examples of the method for preparing the inorganic fine particle-dispersed paste composition of the present invention includes a method comprising mixing an aliphatic polycarbonate resin, a solvent, inorganic fine particles, and optionally an additive while stirring by using a conventionally known stirring method, and the like.

Examples of the known stirring method include a method of kneading with an apparatus such as a ball-mill, a Brabender mill, or a triple roller mill, a method of kneading with a mortar, and the like.

The thermally decomposable binder or the inorganic fine particle-dispersed paste composition of the present invention can be kneaded with raw materials and molded, followed by sintering and dewaxing to thus obtain a molded article. In the sintering step, the aliphatic polycarbonate resin of the present invention can be thermally decomposed by low-temperature heating and removed.

EXAMPLES

The present invention is described in more detail with reference to Examples. However, the present invention is not limited to these Examples. The physical properties etc. of the aliphatic polycarbonate resin and the like were measured in accordance with the following methods.

Content of Constituent Unit Represented by Formula (1) in Aliphatic Polycarbonate Resin The compositional ratio of the constituent units in the resin is analyzed by $^1$H-NMR, and the amino group content in the aliphatic polycarbonate resin is determined as the content of the constituent unit represented by formula (1).

The aliphatic polycarbonate resin is subjected to $^1$H-NMR measurement in deuterated chloroform at 25° C. Then, an integral value (A) of the peak appeared near 5.0 ppm, ascribed to the methine group adjacently attached to the carbonate group and an integral value (B) of the peak appeared near 2.4 ppm, ascribed to the methylene group adjacently attached to the amino group are determined, and the amino group content is calculated using the following calculation formula.

Amino group content (% by mole)=$B/(2 \times A) \times 100$

If the amino group content is small, calculation using the above method could be difficult. In this case, assuming that the amount of amino group would not change in the step of obtaining an amino group-containing polycarbonate resin from an amino group-containing polycarbonate resin precursor whose amino group is protected, the precursor is subjected to $^1$H-NMR measurement in deuterated chloroform at 25° C., and an integral value (C) of peaks ascribed to groups containing a protective group and an integral value (D) of peaks ascribed to groups contained in constituent units not containing a protective group are determined to calculate the amino group content using the following calculation formula. For example, in the case of Example 1, the integral value (C) of the peak appeared near 3.7 to 3.5 ppm, ascribed to the methylene group adjacently attached to the phenyl group and the integral value (D) of the peak appeared near 1.4 to 1.3 ppm, ascribed to the methyl group are used.

Amino group content (% by mole)=$3 \times C/(3 \times C + 4 \times D) \times 100$ Number Average Molecular Weight (Mn) of Aliphatic Polycarbonate Resin A chloroform solution having an aliphatic polycarbonate resin concentration of 0.5% by mass is prepared, and subjected to a measurement using high-performance liquid chromatography. After measurement, the number average molecular weight is determined by comparison with polystyrene with known number average molecular weight measured under the same conditions. The measurement conditions are as follows:
Column: GPC column (trade name: Shodex K-804L, produced by Showa Denko K.K.)
Column temperature: 40° C.
Eluate: Chloroform
Flow rate: 1.0 mL/min
Initial Thermal Decomposition Temperature of Aliphatic Polycarbonate Resin Thermal decomposition behaviors are measured by increasing the temperature from room temperature to 400° C. at a heating rate of 20° C./min in a nitrogen atmosphere using TG/DTA6200 produced by Hitachi High-Tech Science. The initial thermal decomposition temperature is indicated by the intersection of a line drawn parallel to the abscissa at the mass before the initiation of a heating test, and a tangent line drawn so that an incline between the inflection points in the decomposition curve is at its maximum.

Mass Loss Percentage of Aliphatic Polycarbonate Resin after being Maintained at a Given Temperature for 1 Hour The temperature is increased from room temperature to a given temperature (160° C. or 100° C.) at a heating rate of 50° C./min in a nitrogen atmosphere using TG/DTA7220 produced by Hitachi High-Tech Science, and the temperature is maintained for 1 hour, followed by the measurement of thermal decomposition behaviors. The mass loss percentage is obtained by reading off the mass (W1) after one-hour heating from the decomposition curve, and calculating the ratio relative to the initial mass (W0), i.e., $[(W0-W1)/W0 \times 100]$.

Production Example 1: Production of Cobalt Complex

A 0.2-L three-necked flask equipped with a stirrer and a gas inlet tube was charged with 5.0 g (8.3 mmol) of (S,S)—N,N'-bis(3,5-di-tert-butylsalicylidene)-1,2-cyclohexanediaminocobalt (purchased from Aldrich), 1.80 g (8.5 mmol) of pentafluorobenzoic acid, and 100 mL of dichloromethane, and the contents were stirred for 12 hours while introducing air thereinto to allow the components to react. The volatile component was distilled off under a reduced pressure, and thereafter the solid obtained was washed with 100 mL of cold hexane, to give a cobalt complex represented by the above formula (4-3) as a brown solid (yield amount: 6.6 g, yield rate: 98.5%).

Production Example 2: Production of N-oxiranylmethyldibenzylamine

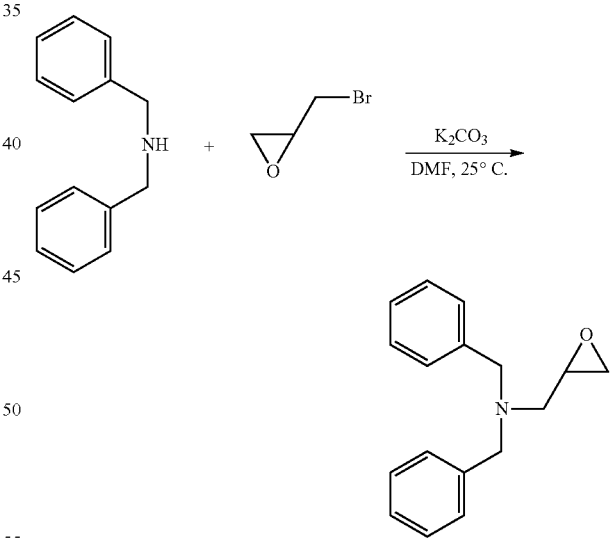

A 50-mL Schlenk flask containing a magnetic stirring bar was charged with 865 mg (6.3 mmol) of potassium carbonate. Then, after the internal system was replaced with an argon atmosphere, the system was charged with 10 mL of N,N-dimethylformamide (DMF), 1 mL (5.3 mmol) of dibenzylamine, and 8.5 mL (6.2 mmol) of epibromohydrin. After the resulting mixture was stirred at ordinary temperature for 65 hours, and extracted 3 times with 10 mL of dichloromethane, the combined organic layers were washed twice with 30 mL of saturated brine and once with ion exchanged water. The organic layers were concentrated under reduced pressure, and the obtained residue was purified by silica column chromatography (hexane/ethyl acetate=4/1, Rf=0.53) to give a colorless oily N-oxiranylmethyldibenzylamine (yield amount: 0.932 g, yield rate: 70%).

The structure of the obtained compound was identified by 1H-NMR.

$^1$H-NMR (CDCl$_3$) δ7.39 (d, J=6.9 Hz, 4H), 7.31 (t, J=7.6 Hz, 4H), 7.23 (t, J=7.1 Hz, 2H), 3.80 (d, J=13.7 Hz, 2H), 3.56 (d, J=13.7 Hz, 2H), 3.10-3.06 (m, 1H), 2.77 (dd, J=14.0, 3.2 Hz, 1H), 2.67 (t, J=4.6 Hz, 1H), 2.45-2.40 (m, 2H)ppm.

Example 1a: Production of Amino Group-Containing Aliphatic Polycarbonate Resin Precursor

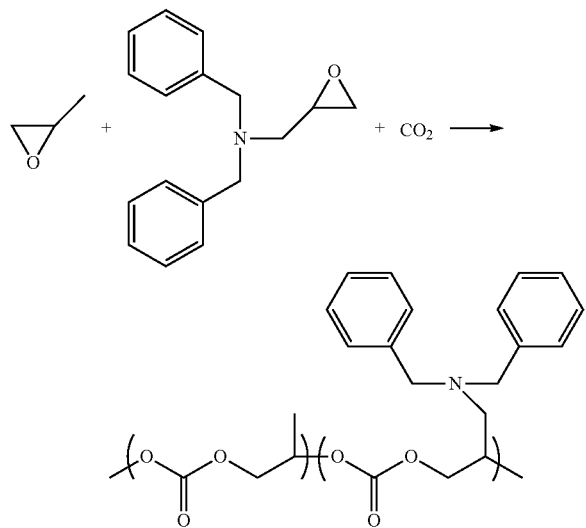

A 50-mL autoclave was charged with 12 mg (0.014 mmol) of the cobalt complex obtained in Production Example 1 and 8.0 mg (0.014 mmol) of bis(triphenylphosphoranylidene) ammonium chloride. After the internal system was replaced with an argon atmosphere, the system was charged with 2.0 mL (28 mmol) of propylene oxide and 0.31 mL (1.4 mmol) of N-oxiranylmethyldibenzylamine obtained in Production Example 2. Next, carbon dioxide was added thereto while stirring until the internal reaction system reached 1.5 MPa. Thereafter, the polymerization reaction was carried out at 40° C. for 24 hours. After completion of the reaction, the autoclave was depressurized, methanol/1 M hydrochloric acid=10 mL/1 mL was added thereto, and the reaction was stopped. Thereafter, a small amount of dichloromethane was added, in which the contents were dissolved, and the resulting product was added dropwise to methanol to precipitate a white solid. The obtained white solid was collected by filtration and dried under reduced pressure to give 1.67 g of a dibenzylamino group-containing aliphatic polycarbonate resin. The obtained aliphatic polycarbonate resin had a number average molecular weight of 32,000, and the amount of dibenzylamino group introduced was 7.2% by mole. The structure of the obtained aliphatic polycarbonate resin was identified by $^1$H-NMR.

$^1$H-NMR (CDCl$_3$) δ=7.32-7.23 (10H, —C$_6$H$_5$), 5.04-4.95 (1H, —(CO)O—CH—), 4.31-4.09 (2H, —CH$_2$—O(CO)—), 3.71-3.52 (2H, Ph-CH$_2$—N—), 2.70 (2H, —N—CH$_2$—C—O—) 1.35-1.30 (3H, —CH$_3$)ppm.

Production of Amino Group-containing Aliphatic Polycarbonate Resin

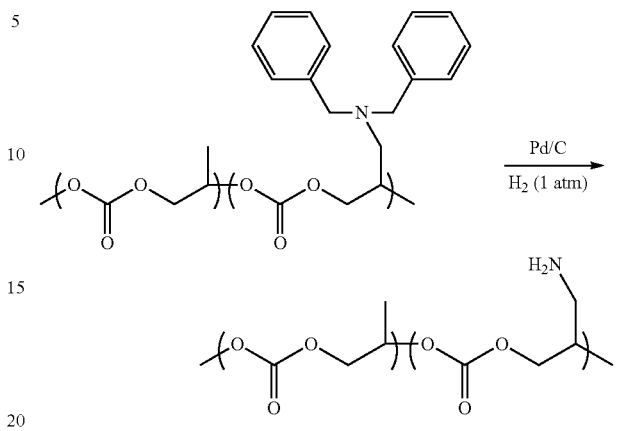

A 100-mL Schlenk flask was charged with 1.12 g of dibenzylamino group-containing aliphatic polycarbonate resin obtained above, 0.34 g of 10% palladium carbon, 22 mL of ethyl acetate, and 12 mL of methanol, followed by freeze-pump-thaw. Thereafter, the inside of the reactor was replaced with hydrogen, and the contents were stirred at 40° C. under 1 atmosphere of hydrogen for 68 hours. The solid was then removed by filtration, the filtrate obtained was concentrated, and the concentrated filtrate was poured into methanol to precipitate a solid. The obtained solid was dried to give 1.02 g of an amino group-containing aliphatic polycarbonate resin. The structure of the obtained amino group-containing aliphatic polycarbonate resin was identified by $^1$H-NMR.

$^1$H-NMR (CDCl$_3$) δ=5.04-4.97 (1H, —(CO)O—CH—), 4.30-4.10 (2H, —CH$_2$—O(CO)—), 2.70 (2H, —N—CH$_2$—C—O—) 1.35-1.32 (3H, —CH$_3$)ppm.

Comparative Example 1

The reaction was carried out in the same manner as in Example 1a, except that N-oxiranylmethyldibenzylamine was not used in the polymerization reaction, to give 2.06 g of an aliphatic polycarbonate resin that did not contain an amino group.

Example 1b

The polymerization reaction was carried out in the same manner as in Example 1a, except that the reaction temperature was changed to 20° C., to give 1.54 g of a dibenzylamino group-containing aliphatic polycarbonate resin. This aliphatic polycarbonate resin had a number average molecular weight of 57,000, and the amount of the dibenzylamino group introduced was 1.7% by mole. Further, deprotection was performed in the same manner to give 1.02 g of an amino group-containing aliphatic polycarbonate resin.

Example 1c

The polymerization reaction was carried out in the same manner as in Example 1a, except that the amount of N-oxiranylmethyldibenzylamine was changed to 0.62 mL (2.8 mmol), to give 1.40 g of a dibenzylamino group-containing aliphatic polycarbonate resin. This aliphatic polycarbonate resin has a number average molecular weight of 25,000, and the amount of the dibenzylamino group introduced was 2.9 mol %. Further, deprotection was performed in the same manner to give 1.0 g of an amino group-containing aliphatic polycarbonate resin.

Example 1d

The polymerization reaction was carried out in the same manner as in Example 1a, except that the amount of N-oxiranylmethyldibenzylamine was changed to 1.24 mL (5.6 mmol), to give 0.94 g of a dibenzylamino group-containing aliphatic polycarbonate resin. This aliphatic polycarbonate resin has a number average molecular weight of 24,000, and the amount of the dibenzylamino group introduced was 4.2 mol %. Further, deprotection was performed in the same manner to give 0.9 g of an amino group-containing aliphatic polycarbonate resin.

Example 1e

The amino group-containing aliphatic polycarbonate resin obtained in Example 1b (0.5 g) and the aliphatic polycarbonate resin that did not contain the amino group obtained in Comparative Example 1 (0.5 g) were dissolved in 5 mL of acetone, and mixed, followed by drying again, to give 1.0 g of a mixture of aliphatic polycarbonate resins. As a result of the analysis of the compositional ratio of the constituent units of the entire resin constituting the resin mixture, the amino group content was about 0.8 mol % (half of the amino group content of Example 1b).

The FIGURE is a graph showing TG-DTA (thermogravimetric differential thermal analysis) curves of the amino group-containing aliphatic polycarbonate resin obtained in Example 1a and the aliphatic polycarbonate resin that did not contain an amino group obtained in Comparative Example 1.

Table 1 shows the number average molecular weight, the amino group content (the content of the constituent unit represented by formula (1)), the initial thermal decomposition temperature, the mass loss percentage after being maintained at 160° C. for 1 hour, and the mass loss percentage after being maintained at 100° C. for 1 hour, of the aliphatic polycarbonate resins obtained in the Examples and the Comparative Examples.

The number average molecular weight (Mn) of each Example shown in Table 1 is the number average molecular weight of the amino group-containing aliphatic polycarbonate resin, and is a value calculated as follows based on the number average molecular weight of dibenzylamino group-containing aliphatic polycarbonate resin.

Calculation of Number Average Molecular Weight of Amino Group-Containing Aliphatic Polycarbonate Resin Assuming that the aliphatic polycarbonate resin would not undergo decomposition by deprotection reaction, and considering that the percentage of the dibenzylamino group-containing constituent unit in the dibenzylamino group-containing aliphatic polycarbonate resin as a % by mole, the number average molecular weight of amino group-containing aliphatic polycarbonate resin after deprotection reaction can be calculated using the following formula:

$$Mn1 = Mn2 \times (1 - 180 \times a/(102 \times (100-a) + 295 \times a))$$

wherein Mn1 represents the number average molecular weight of amino group-containing aliphatic polycarbonate resin, and Mn2 represents the number average molecular weight of dibenzylamino group-containing aliphatic polycarbonate resin.

TABLE 1

| | | | Amino group-containing aliphatic polycarbonate resin | | | | |
|---|---|---|---|---|---|---|---|
| | Propylene | | | Content of constituent | Initial thermal decomposition | Mass loss percentage (1 h) | |
| | oxide | N-oxiranylmethyldibenzylamine | Mn | unit of formula (1) | temperature | 160° C. | 100° C. |
| Ex. 1a | 2.0 mL (28 mmol) | 0.31 mL (1.4 mmol) | 28,000 | 7.2 mol % | 156° C. | 96.4% | 0.3% |
| Ex. 1b | 2.0 mL (28 mmol) | 0.31 mL (1.4 mmol) | 55,000 | 1.7 mol % | 161° C. | 95.5% | 0.2% |
| Ex. 1c | 2.0 mL (28 mmol) | 0.62 mL (2.8 mmol) | 24,000 | 2.9 mol % | 159° C. | 96.1% | 0.4% |
| Ex. 1d | 2.0 mL (28 mmol) | 1.24 mL (5.6 mmol) | 22,000 | 4.2 mol % | 157° C. | 95.6% | 0.3% |
| Ex. 1e | — | — | 98,000 | 0.8 mol % | 161° C. | 96.1% | 0.3% |
| Comp. Ex. 1 | 2.0 mL (28 mmol) | — | 177,000 | — | 220° C. | 4.4% | 0.1% |

Example 2

A 5-mL eggplant-shaped flask was charged with 0.12 g of the amino group-containing aliphatic polycarbonate resin obtained in Example 1a and 0.88 g of N-methyl-2-pyrrolidone, followed by dissolution to give 1.0 g of a uniform binder solution.

Silver particles (trade name: S-211, produced by DAIKEN CHEMICAL CO., LTD., median particle size: 0.311 μm) (4.0 g) were weighed and placed in a mortar, and the entire amount of the binder solution was gradually added thereto while kneading. The mixture was kneaded until it became a uniform paste, to give 5.0 g of a silver particle-dispersed paste composition.

Comparative Example 2

The same procedure as in Example 2 was carried out, except that the aliphatic polycarbonate resin was changed to 0.12 g of the aliphatic polycarbonate resin that did not contain an amino group obtained in Comparative Example 1, to give 5.0 g of a silver particle-dispersed paste composition.

Sintered bodies were produced in accordance with the following procedure using the silver particle-dispersed paste compositions obtained in Example 2 and Comparative Example 2, and the volume resistivity of the obtained sintered bodies was measured. Table 2 shows the results. A high volume resistivity indicates the presence of a resistive component; specifically, the binder resin did not undergo complete decomposition, or although the binder resin underwent decomposition, a great deal of carbon remained. In contrast, a low volume resistivity indicates the absence of a resistive component; specifically, the binder resin underwent complete decomposition with almost no remaining carbon.

Sintered Body Production

The surface of a slide glass (width: 26 mm, length: 76 mm, thickness: 1 mm) used as an insulation substrate was cleaned with acetone. Thereafter, the slide glass was subjected to a surface treatment using a UV/ozone processing unit (trade name: a bench-type photo-surface processing unit PL16-110, produced by SEN LIGHTS CORPORATION), to provide a slide glass for testing.

A rectangular (10 mm×40 mm) pattern was formed on the slide glass for testing with a masking tape, and the silver particle-dispersed paste composition was poured over the patterned slide glass. After coating, the masking tape was removed, and the coating was dried at 25° C. for 6 hours. According to the same method, three coated slide glasses each were prepared for one condition.

Each of the obtained coated slide glasses was heated from 25° C. to a given temperature (150° C. or 180° C.) over 10 minutes using a bench-type electric muffle furnace (trade name: KDF S90, produced by EYELA), maintained for 1 hour at 150° C., or for 10 minutes at 180° C., and then air-cooled to 25° C., to give three sintered bodies each.

Sintered Body Thickness

The thickness of the obtained sintered body was measured with a film thickness measurement instrument (trade name: Microfigure Measuring Instrument surfcorder ET3000i, produced by Kosaka Laboratory Ltd.,), and the average of 3 sintered bodies was obtained. Table 2 shows the results.

Sintered Body Volume Resistivity

The volume resistivity of each sintered body was measured with a resistivity meter (trade name: Loresta EP MCP-T360, produced by Mitsubishi Chemical Corporation), and the average of three sintered bodies was obtained. The volume resistivity is a value calculated by the resistivity meter to which the thickness of the above sintered body is input. Table 2 shows the results.

TABLE 2

| | Sintering temperature: 150° C. | | Sintering temperature: 180° C. | |
|---|---|---|---|---|
| | Thickness (mm) | Volume resistivity (Ω · cm) | Thickness (mm) | Volume resistivity (Ω · cm) |
| Ex. 2 | 0.106 | $2.23 \times 10^{-5}$ | 0.103 | $4.27 \times 10^{-6}$ |
| Comp. Ex. 2 | 0.118 | $2.28 \times 10^{-4}$ | 0.118 | $6.25 \times 10^{-5}$ |

A comparison of Example 2 and Comparative Example 2 reveals that the use of the aliphatic polycarbonate resin of Example 2 as a binder achieved a lower volume resistivity of the sintered body and thus achieved a higher dewaxing efficiency at both of the sintering temperatures.

INDUSTRIAL APPLICABILITY

The aliphatic polycarbonate resin of the present invention is preferably used for, for example, binders of an inorganic fine particle paste, such as electroconductive particles, glass powders, ceramics, and phosphors, and for thermally decomposable materials used for, for example, lost foam casting.

The invention claimed is:

1. A thermally decomposable binder comprising an aliphatic polycarbonate resin comprising a constituent unit represented by formula (1):

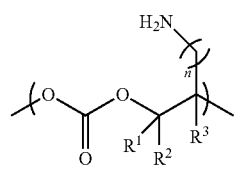

(1)

wherein $R^1$, $R^2$, and $R^3$ are identical or different, and each represents a hydrogen atom, a substituted or unsubstituted alkyl group having 1 to 10 carbon atoms, or a substituted or unsubstituted aryl group having 6 to 20 carbon atoms, and n is 1 or 2.

2. The thermally decomposable binder according to claim 1, wherein the content of the constituent unit represented by formula (1) is 0.001 to 30 mol %, based on the entire constituent units constituting the aliphatic polycarbonate resin.

3. The thermally decomposable binder according to claim 1 or 2, wherein the aliphatic polycarbonate resin further comprises a constituent unit represented by formula (2):

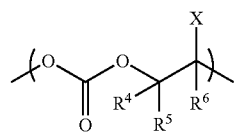

(2)

wherein $R^4$, $R^5$, and $R^6$ are identical or different, and each represents a hydrogen atom, a substituted or unsubstituted alkyl group having 1 to 10 carbon atoms, or a substituted or unsubstituted aryl group having 6 to 20 carbon atoms, wherein two groups from among $R^4$ to $R^6$, taken together with the carbon atom or carbon atoms to which these groups are attached, may form a substituted or unsubstituted, saturated or unsaturated aliphatic ring, and X represents a hydrogen atom, a linear or branched alkyl group having 1 to 10 carbon atoms, a haloalkyl group having 1 to 10 carbon atoms, a cycloalkyl group having 3 to 12 carbon atoms, an ether bond-containing group, an ester bond-containing group, or an allyl group.

4. The thermally decomposable binder according to claim 1, having a mass loss percentage of 90% or more after being maintained at 160° C. for 1 hour in a thermogravimetric analysis measurement.

5. An inorganic fine particle-dispersed paste composition comprising:

an aliphatic polycarbonate resin comprising a constituent unit represented by formula (1):

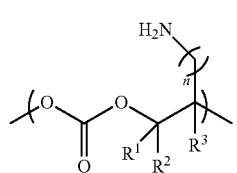

wherein
R$^1$, R$^2$, and R$^3$ are identical or different, and each represents a hydrogen atom, a substituted or unsubstituted alkyl group having 1 to 10 carbon atoms, or a substituted or unsubstituted aryl group having 6 to 20 carbon atoms, and
n is 1 or 2;
   inorganic fine particles; and
   a solvent.

6. The inorganic fine particle-dispersed paste composition according to claim 5, wherein the aliphatic polycarbonate resin is present in an amount of 0.001 to 20 parts by mass, based on 100 parts by mass of the inorganic fine particles.

7. The inorganic fine particle-dispersed paste composition according to claim 5 or 6, wherein the inorganic fine particles comprise at least one member selected from the group consisting of electroconductive particles, ceramic powders, glass powders, and inorganic phosphor fine particles.

* * * * *